(12) United States Patent
Aratani et al.

(10) Patent No.: US 8,008,852 B2
(45) Date of Patent: Aug. 30, 2011

(54) ORGANIC LIGHT-EMITTING DISPLAY DEVICE AND PRODUCTION METHOD OF THE SAME

(75) Inventors: Sukekazu Aratani, Hitachiota (JP); Masao Shimizu, Hitachi (JP); Toshiyuki Matsuura, Mobara (JP); Masahiro Tanaka, Chiba (JP); Masaya Adachi, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 863 days.

(21) Appl. No.: 11/833,269

(22) Filed: Aug. 3, 2007

(65) Prior Publication Data
US 2008/0030129 A1    Feb. 7, 2008

(30) Foreign Application Priority Data

Aug. 7, 2006  (JP) ................................. 2006-214156

(51) Int. Cl.
 *H01J 1/62* (2006.01)
(52) U.S. Cl. ........................................ 313/504; 313/506
(58) Field of Classification Search ............ 313/504–506
See application file for complete search history.

(56) References Cited

U.S. PATENT DOCUMENTS

| 5,554,911 A | 9/1996 | Nakayama et al. | |
|---|---|---|---|
| 2005/0269947 A1 | 12/2005 | Kobayashi | |
| 2005/0285508 A1* | 12/2005 | Murayama et al. | 313/503 |
| 2006/0017377 A1 | 1/2006 | Ryu | |
| 2006/0097264 A1 | 5/2006 | Kim et al. | |
| 2006/0124920 A1 | 6/2006 | Kimura | |
| 2006/0170339 A1 | 8/2006 | Kanno et al. | |

FOREIGN PATENT DOCUMENTS

| JP | 06-275381 | 9/1994 |
|---|---|---|
| JP | 2000-323277 | 11/2000 |
| JP | 2003-142277 | 5/2003 |
| JP | 2003-272855 | 9/2003 |
| JP | 2004-119304 | 4/2004 |
| JP | 2005-347072 | 12/2005 |
| JP | 2006-012579 | 1/2006 |
| JP | 2006-041471 | 2/2006 |
| JP | 2006-140130 | 6/2006 |

OTHER PUBLICATIONS

Japanese Office Action (and its English translation), dated Jan. 13, 2009, issued in corresponding Japanese Patent Application No. 2006-214156.

* cited by examiner

*Primary Examiner* — Joseph L Williams
(74) *Attorney, Agent, or Firm* — Antonelli, Terry, Stout & Kraus, LLP.

(57) ABSTRACT

An organic light-emitting display device is provided which achieves high efficiency by reducing the number of steps for vapor deposition using a mask with a fine pattern and photolithography. A blue light-emitting portion (B), a green light-emitting portion (G) and a red light-emitting portion (R) placed on a substrate 10 have a thickness relationship represented as (blue light-emitting portion (B)<green light-emitting portion (G)=red light-emitting portion (R)), so that the green light-emitting portion (G) and the red light-emitting portion are formed with common deposition steps. In addition, an electron injection layer 2 and an electron transport layer 3 between a lower electrode and an organic light-emitting layer 4 are formed with common depositions steps in the light-emitting portions (B, G and R).

11 Claims, 5 Drawing Sheets

ORGANIC LIGHT-EMITTING DISPLAY DEVICE AND PRODUCTION METHOD OF THE SAME

FIELD OF THE INVENTION

The present invention relates to an organic light-emitting display device and a production method of the same, and more particularly, to a color organic light-emitting display device.

BACKGROUND OF THE INVENTION

In recent years, organic light-emitting display devices have received attention as a next-generation flat display device. The organic light-emitting display devices have excellent characteristics such as self-emission, a wide viewing angle, and a fast response speed.

A typical organic light-emitting device has a structure provided by sequentially forming, on a glass substrate, a transparent electrode made of ITO or the like, an organic layer including a hole transport layer, a light-emitting layer and an electron transport layer, and a reflecting electrode having a low work function. Emitted light is transmitted through the transparent electrode and is taken from the bottom of the glass substrate.

Each layer of the organic light-emitting device has a thickness of several tens to several hundreds of nanometers and is subjected to light interference. The interference is used to increase the efficiency of light emission in colors of blue, green, and red.

For example, JP-A-2003-142277 (Patent Document 1) has disclosed a display in which ITOs have different film thicknesses for different colors of blue, green, and red to increase the efficiency of light emission in the respective colors. JP-A-2001-323277 (Patent Document 2) has disclosed a display in which organic layers having the same function are formed to have different film thicknesses for different colors of emitted light to increase the efficiency of light emission in the respective colors.

Patent Document 1: JP-A-2003-142277
Patent Document 2: JP-A-2000-323277

BRIEF SUMMARY OF THE INVENTION

The structure described in JP-A-2003-142277 can provide enhanced efficiency of light emission in the respective colors. However, the number of steps in the manufacture process is inevitably increased. Specifically, the ITOs having the different film thicknesses for the respective colors require two additional steps for deposition and two additional steps for patterning through photolithography. As a result, the structure cannot be manufactured at low cost.

The structure described in JP-A-2000-323277 can also provide increased efficiency of light emission in the respective colors. However, at least two steps for deposition need to be added. Each of the two steps for deposition requires precise deposition only in a light-emitting portion for each color. When vacuum deposition is used therefor, it is necessary to use a mask formed with high accuracy to attain precise alignment for deposition. Such a deposition process including the two steps needs to place the mask having a fine pattern close to a pixel portion of a substrate, so that defective display may be caused in pixels.

In addition, the mask having the fine pattern requires an extra time for alignment other than the time for vapor deposition, leading to a longer time period taken for the process.

It is an object of the present invention to provide an organic light-emitting display device which involves no reduction in efficiency of light emission in colors of blue, green and red, and which is provided through a simplified manufacture process, and a production method of the organic light-emitting display device.

To achieve the abovementioned objects, the present invention provides an organic light-emitting display device including a blue light-emitting portion, a green light-emitting portion and a red light-emitting portion wherein the distances from light-emitting layers to upper electrodes are the same in at least two of the light-emitting portions. In addition, the film thicknesses between reflecting electrodes and the organic light-emitting layers are the same in the light-emitting portions.

The same thickness or the same film thickness means that they are the same within accuracy of deposition in deposition steps. Specifically, it refers to an error of film thickness of ±7% or smaller.

DESCRIPTION OF REFERENCE NUMERALS

1 LOWER ELECTRODE
2 ELECTRON INJECTION LAYER
3 ELECTRON TRANSPORT LAYER
4 ORGANIC LIGHT-EMITTING LAYER
5 HOLE TRANSPORT LAYER
6 BUFFER LAYER
7 UPPER ELECTRODE
8 FIRST PASSIVATION FILM
9 SECOND PASSIVATION FILM
10 TRANSPARENT INSULATING SUBSTRATE
11 LOWER ELECTRODE
12 HOLE INJECTION LAYER
13 HOLE TRANSPORT LAYER
14 ORGANIC LIGHT-EMITTING LAYER
15 ELECTRON TRANSPORT LAYER
16 ELECTRON INJECTION LAYER
17 UPPER ELECTRODE
25 ELECTRON TRANSPORT LAYER

DETAILED DESCRIPTION OF THE INVENTION

Examples of an organic light-emitting display device and a production method of the same according to the present invention will hereinafter be described with the accompanying drawings.

EXAMPLE 1

Figure 1:
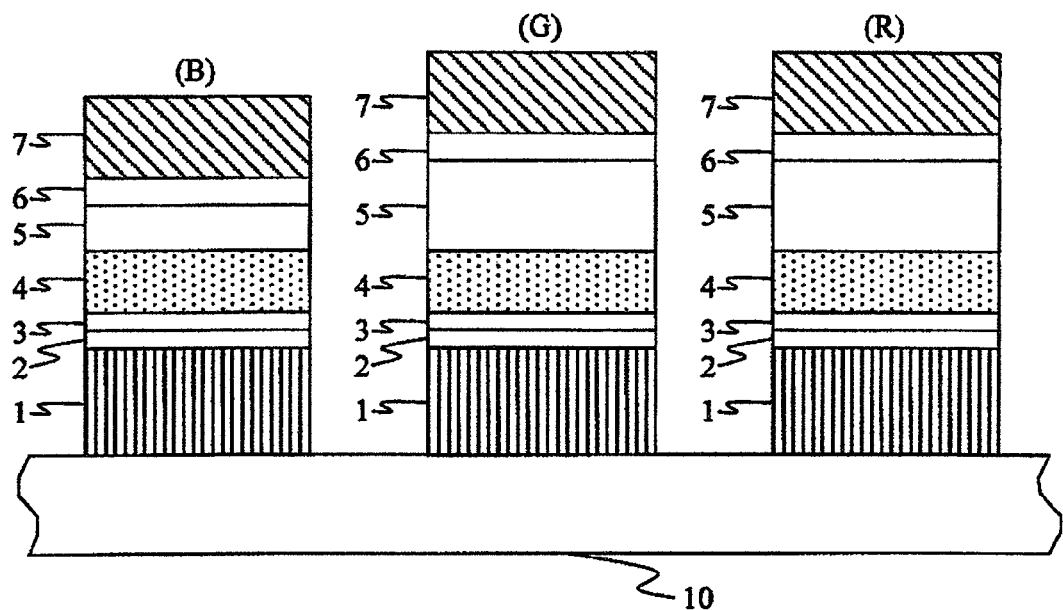
FIG. 1 is a sectional view showing a pixel portion of Example 1.
Figure 2:
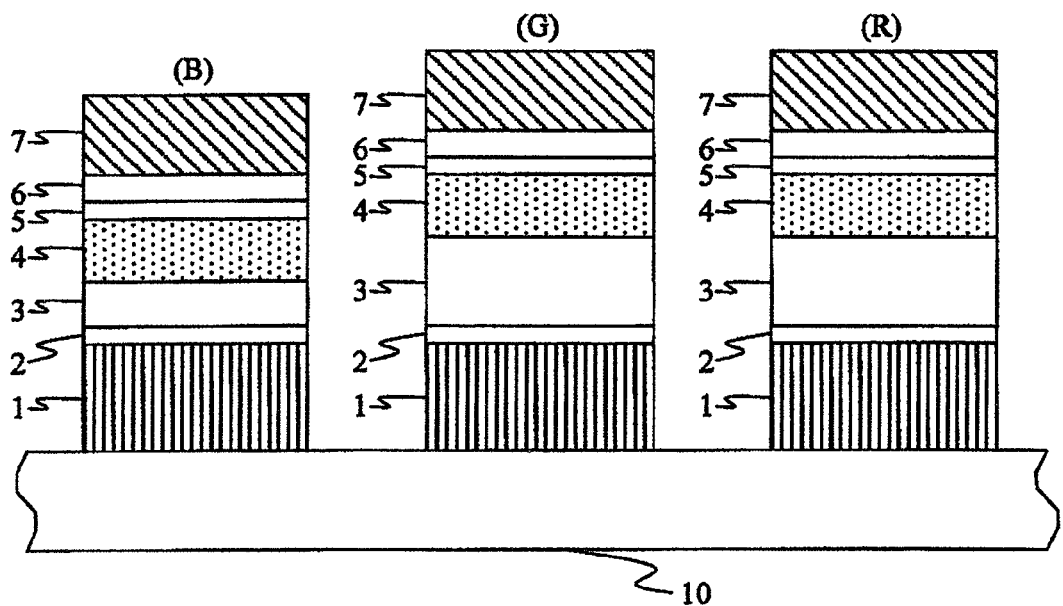
FIG. 2 is a sectional view showing a pixel portion of Example 1.

FIG. 1 is a sectional view showing a pixel portion including a blue light-emitting portion (B), a green light-emitting portion (G) and a red light-emitting portion (R) of an organic light-emitting display device according to Example 1. Such pixel portions are arranged in a matrix on a transparent insulating substrate 10. The blue light-emitting portion (B), the green light-emitting portion (G) and the red light-emitting portion (R) are each formed in stripes and are arranged in this order.

In FIG. 1, a lower electrode 1, an electrode injection layer 2, an electron transport layer 3, an organic light-emitting layer 4, a hole transport layer 5, a buffer layer 6 and an upper electrode 7 are stacked in this order on the transparent insulating substrate 10. The upper electrode 7 is embodied by a transparent electrode and the lower electrode 1 is embodied by a reflecting electrode. The organic light-emitting display device is of a top-emission type in which emitted light from the organic light-emitting layer 4 is taken from the upper electrode 7. The lower electrode 1 serves as a cathode and the upper electrode 7 serves as an anode. Alternatively, the organic light-emitting display device may be of a bottom-emission type in which the lower electrode 1 is embodied by a transparent electrode, the upper electrode 7 is embodied by a reflecting electrode, and emitted light from the organic light-emitting layer 4 is taken from the lower electrode 1.

In Example 1, the hole transport layer 5 of the green light-emitting portion (G) has the same thickness as that of the red light-emitting portion (R), and the hole transport layer 5 of the blue light-emitting portion (B) has a different thickness.

Each of the electrodes and the layers will hereinafter be described.

The lower electrode 1 is made of Al (aluminum) deposited through EB vapor deposition. The lower electrode 1 was patterned by using a shadow mask. The lower electrodes 1 have the same thickness of 100 nm in the blue light-emitting portion (B), the green light-emitting portion (G) and the red light-emitting portion (R).

The material of the cathode used in the lower electrode 1 is preferably a conductive film having a low work function to increase the efficiency of injection of electrons. Specifically, the material includes, but is not limited to, an alloy of aluminum and neodymium, an alloy of magnesium and silver, and alloy of aluminum and lithium, an alloy of aluminum and calcium, an alloy of aluminum and magnesium, metal calcium, and a cerium compound.

It is also possible to use a conductive oxide such as ITO and IZO and a metal having a high work function such as Ag and Cr to achieve electron injection if the electron injection layer 2 is embodied by a doped injection layer including an electron donating dopant. When such a transparent conductive oxide such as ITO and IZO is used, a reflective metal such as aluminum, silver, chromium, molybdenum and an alloy thereof may be placed under the oxide to take light from the top thereof efficiently.

The electron injection layer 2 is used to increase the efficiency of electron injection from the lower electrode 1 serving as the cathode into the electron transport layer 3. In Example 1, vacuum deposition was performed to provide a co-evaporated film of tris(8-hydroxyquinolinato)aluminum and Li in a 1:1 ratio having a thickness of 10 nm. The electron injection layers 2 were formed collectively through vapor deposition using a mask to have the same thickness in the blue light-emitting portion (B), the green light-emitting portion (G) and red light-emitting portion (R).

The electron injection layer 2 may be made of LiF, CsF, BaF, or another material including both of an electron donating dopant and an electron transporting material.

Specifically, the electron donating dopant is preferably lithium, magnesium, calcium, strontium, barium, aluminum, an alkali metal compound, an alkaline-earth metal compound, a rare-earth metal compound, an organic metal complex containing an alkali metal ion, an organic metal complex containing an alkaline-earth metal ion, an organic metal complex containing a rare-earth metal ion, a tetrathiafulvalene derivative, rhodamine B chloride, pyronin B chloride and the like. It goes without saying that the material is not limited thereto and two or more of the abovementioned materials may be used in combination.

The host material of the electron injection layer 2 is preferably tris(8-hydroxyquinolinato)aluminum, an oxadiazole derivative, a silole derivative, a benzothiazole Zn complex, a phenanthroline derivative and the like. It goes without saying that the material is not limited thereto and two or more of the abovementioned materials may be used in combination.

The electron transport layer 3 is responsible for transporting and injecting electrons into the light-emitting layer, so that the layer 3 preferably has high electron mobility. In Example 1, a tris(8-hydroxyquinolinato)aluminum film having a thickness of 10 nm was formed through vacuum deposition and used as the layer 3. The electron transport layers 3 were formed collectively through vapor deposition using a mask to have the same thickness in the blue light-emitting portion (B), the green light-emitting portion (G) and red light-emitting portion (R).

The material of the electron transport layer 3 is not limited to the abovementioned one, and specifically, an oxadiazole derivative, a silole derivative, a benzothiazole Zn complex, or a phenanthroline derivative may be used. It goes without saying that the material is not limited thereto and two or more of the abovementioned materials may be used in combination.

The organic light-emitting layer 4 is a layer in which injected holes are re-combined with electrons to emit light at a wavelength specific to the material. In Example 1, a distyrylarylene derivative (DPVBi) film having a thickness of 40 nm was formed through vapor deposition as the organic light-emitting layer in the blue light-emitting portion (B).

The organic light-emitting layer in the green light-emitting portion (G) was formed through dual simultaneous vacuum deposition of a co-evaporated film tris(8-hydroxyquinolinato)aluminum (Alq) and quinacridone having a thickness of 40 nm at a controlled deposition rate of 40:1.

The organic light-emitting layer in the red light-emitting portion (R) was embodied by a co-evaporated film of tris(8-hydroxyquinolinato)aluminum and 4-(dicyanomethylene)2-methyl-6-(paradimethylaminostyryl)-4H-pyran (DCM) having a thickness of 40 nm at a controlled deposition rate of 100:2.

The organic light-emitting layer 4 was patterned through vapor deposition by using a shadow mask manufactured with high accuracy.

The material of the organic light-emitting layer 4 is not limited to the abovementioned ones. For example, the host material is preferably a distyrylarylene derivative (DPVBi), a silole derivative (2PSP) having a benzene ring in the skeleton, an oxodiazole derivative (EM2) having a triphenylamine structure at both ends, a perinone derivative (P1) having a phenanthrene group, an oligothiophene derivative (BMA-3T) having a triphenylamine structure at both ends, a perylene derivative (tBu-PTC), tris(8-hydroxyquinolinato)aluminum, a polyparaphenylene vinylene derivative, a polythiophene derivative, a polyparaphenylene derivative, a polysilane derivative, a polyacetylene derivative, a carbazole derivative, a hydroxyquinolinato metal complex and the like. It goes without saying that the material is not limited thereto and two or more of the abovementioned materials may be used in combination.

The dopant material is preferably quinacridone, coumarin 6, nile red, rubrene, 4-(dicyanomethylene)-2-methyl-6-(paradimethylaminostyryl)-4H-pyran (DCM), a dicarbazole derivative, an iridium complex, and a platinum complex. It goes without saying that the material is not limited thereto and two or more of the abovementioned materials may be used in combination.

The hole transport layer 5 is responsible for transporting and injecting holes into the light-emitting layer, so that the layer 5 preferably has high hole mobility, is chemically stable, and has a high glass transition temperature. In Example 1, the hole transport layer 5 was formed through vacuum deposition of 4,4'-bis[N-(1-naphthyl)-N-phenylamino]biphenyl (α-NPD).

The hole transport layer 5 has a thickness of 30 nm in the blue light-emitting portion (B). The layers 5 have a thickness of 65 nm in the green light-emitting portion (G) and the red light-emitting portion (R). The layers 5 were formed through two operations of vapor deposition with a mask having a fine pattern, one for the blue light-emitting portion (B) and one for the green light-emitting portion (G) and the red light-emitting portion (R).

The material of the hole transport layer 5 is not limited to α-NPD, and may be N,N'-bis(3-methylphenyl)-N,N'-diphenyl-[1,1'-biphenyl]-4,4'diamine (TPD), 4,4',4''-tri(N-carbazolyl)triphenylamine (TCTA), and 1,3,5-tris[N-(4-diphenylaminophenyl)phenylamino]benzene (p-DPA-TDAB). It goes without saying that the material is not limited thereto and two or more of the abovementioned materials may be used in combination.

The buffer layer 6 is formed to reduce damage to the hole transport layer 5 in forming the upper electrode 7 and to inject holes into the hole transport layer 5. In Example 1, vanadium oxide was formed through EB vapor deposition. The buffer layer 6 was patterned by using a shadow mask. The buffer layers 6 were formed collectively to have the same thickness of 15 nm in the blue light-emitting portion (B), the green light-emitting portion (G) and red light-emitting portion (R).

The material of the buffer layer 6 is not limited to the abovementioned one, and may be oxide such as molybdenum oxide and tungsten oxide. It is preferable to use oxide with a low partial pressure of oxygen in deposition. It is also possible to use an organic material such as copper phthalocyanine as long as it can reduce damage in forming the upper electrode.

The upper electrode 7 was embodied by an IZO film formed through sputtering and having a thickness of 60 nm. The upper electrodes 7 were formed collectively to have the same thickness in the blue light-emitting portion (B), the green light-emitting portion (G) and the red light-emitting portion (R).

The upper electrode 7 may be an electrode having high light transmission and may be formed of a transparent electrode made of ITO and ZnO or a thin film electrode made of Cr, other than IZO. When an electrode having high resistance such as IZO and ITO is used, an electrode of Al or the like may be partially provided as an auxiliary electrode. This can reduce variations in luminance due to a reduced voltage resulting from the resistance of the upper electrode 7.

COMPARATIVE EXAMPLE 1

An organic light-emitting device of Comparative Example 1 differs from the organic light-emitting device of Example 1 in that a red light-emitting portion (R) has a hole transport layer 5 which is not identical to a hole transport layer 5 of a green light-emitting portion (G) and has a thickness of 100 nm in contrast to the thickness of 65 nm of the hole transport layer 5 in Example 1. In Comparative Example 1, the hole transport layers have thicknesses of 40 nm in a blue light-emitting portion, 65 nm in the green light-emitting portion and 100 nm in the red light-emitting portion, so that each of the blue, green and red light-emitting portions was deposited through vapor deposition using a mask with a fine pattern.

The blue light-emitting portion (B), the green light-emitting portion (G) and the red light-emitting portion (R) in Example 1 were lit to emit white light. The light-emitting portions in Comparative Example 1 were lit to emit white light in a similar manner. The chromaticity coordinates of the white color emission are (CIEx, CIEy)=(0.30, 0.31). The measurement of power efficiency of the white color in the chromaticity at 100 cd/m$^2$ showed that the efficiency in Example 1 was 1.05 times higher than the efficiency in Comparative Example 1. It is thus evident that the organic light-emitting display device with high efficiency can be provided even when the number of vapor deposition operations using the mask with the fine pattern is reduced as in Example 1.

In Example 1, the electron injection layers 2, the electron transport layers 3 and the buffer layers 6 are common to the three light-emitting portions, and the hole transport layers 5 have the thicknesses of 30 nm in the blue light-emitting portion (B) and 65 nm in the green light-emitting portion (G) and the red light-emitting portion (R). In other words, the blue light-emitting portion (B) has a thickness of 265 nm, and the green light-emitting portion (G) and the red light-emitting portion (R) have a thickness of 300 nm, so that the light-emitting portions (B, G and R) have the thickness relationship represented as (blue light-emitting portion (B)<green light-emitting portion (G)=red light-emitting portion (R)).

EXAMPLE 2

Figure 3:
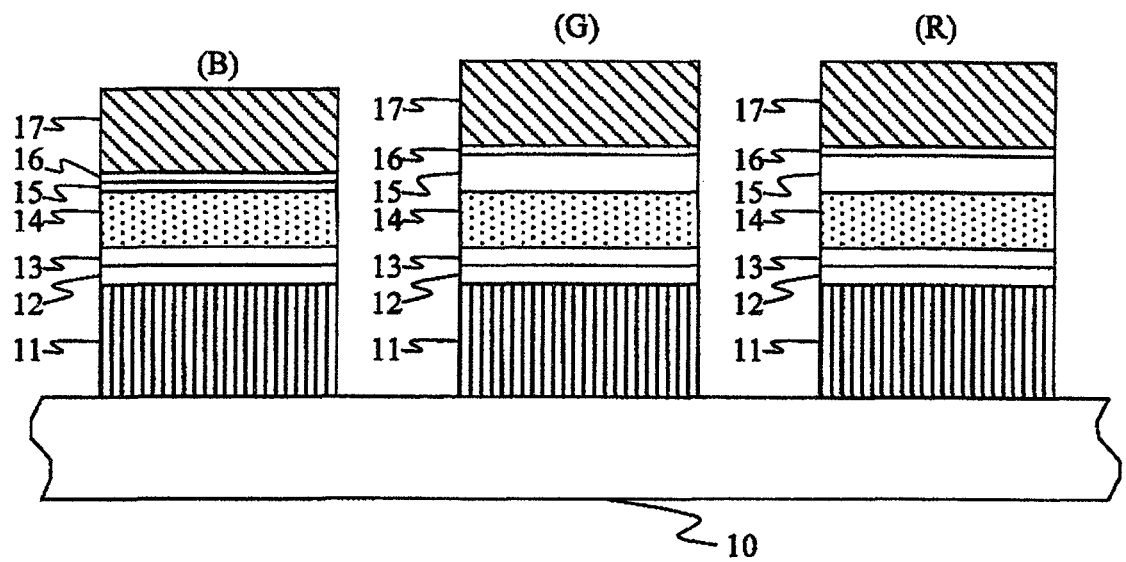
FIG. 3 is a sectional view showing a pixel portion of Example 2.

FIG. 3 is a sectional view showing a pixel portion of Example 2. In FIG. 3, a lower electrode 11 serves as an anode and an upper electrode 17 serves as a cathode. In this case, the lower electrode 11, a hole injection layer 12, a hole transport layer 13, an organic light-emitting layer 14, an electron transport layer 15, an electron injection layer 16, and the upper electrode 17 are stacked in this order on a transparent insulating substrate 10. The same materials as those in Example 1 are used except for the lower electrode 11 formed of a stacked structure of Al and ITO.

The lower electrodes 11 have a thickness of 100 nm. The hole injection layers 12 have the same thickness of 20 nm in all of light-emitting portions (B, G and R). The hole transport layers 13 also have the same thickness of 20 nm. The organic light-emitting layers 14 have the same thickness of 40 nm in all of the light-emitting portions (B, G and R). The electron transport layers 15 have a thickness of 10 nm in the blue light-emitting portion (B) and a thickness of 25 nm in the green light-emitting portion (G) and the red light-emitting portion (R). The electron injection layers 16 have the same thickness of 10 nm in all of the light-emitting portions (B, G and R). The upper electrodes 17 have a thickness of 60 nm.

The organic light-emitting layer 14 was formed through vapor deposition using a mask with a fine pattern for each of the light-emitting portions (B, G and R). The electron injection layers 16 were formed through two operations of vapor deposition using a mask with a fine pattern, one for the blue light-emitting portion (B) and one for the green light-emitting portion (G) and the red light-emitting portion (R).

COMPARATIVE EXAMPLE 2

An organic light-emitting device of Comparative Example 2 differs from Example 2 in that a red light-emitting portion (R) has an electron transport layer 15 having a thickness of 65 nm instead of 25 nm in Example 2. In Comparative Example 2, the electron transport layers have thicknesses of 10 nm in the blue light-emitting portion, 25 nm in the green light-emitting portion and 65 nm in the red light-emitting portion, so that each of the blue, green and red light-emitting portions was deposited through vapor deposition using a mask with a fine pattern.

The blue light-emitting portion (B), the green light-emitting portion (G) and the red light-emitting portion (R) in Example 2 were lit to emit white light. The light-emitting portions in Comparative Example 2 were lit to emit white light in a similar manner. The chromaticity coordinates of the white color emission are (CIEx, CIEy)=(0.30, 0.31). The measurement of power efficiency of the white color in the chromaticity at 100 cd/m$^2$ showed that the efficiency in Example 2 was 1.0 time higher than the efficiency in Comparative Example 2. It is thus evident that the organic light-emitting display device with no reduction in efficiency can be provided even when the number of vapor deposition operations using the mask with the fine pattern is reduced as in Example 2.

In Example 2, the hole injection layers 12, the hole transport layers 13 and the electron injection layers 16 are common to the three light-emitting portions, and the electron transport layers 15 have the thicknesses of 10 nm in the blue light-emitting portion (B) and 25 nm in the green light-emitting portion (G) and the red light-emitting portion (R). In other words, the blue light-emitting portion (B) has a thickness of 260 nm, and the green light-emitting portion (G) and the red light-emitting portion (R) have a thickness of 276 nm, so that the light-emitting portions (B, G and R) have the thickness relationship represented as (blue light-emitting portion (B)<green light-emitting portion (G)=red light-emitting portion (R)).

Figure 4:
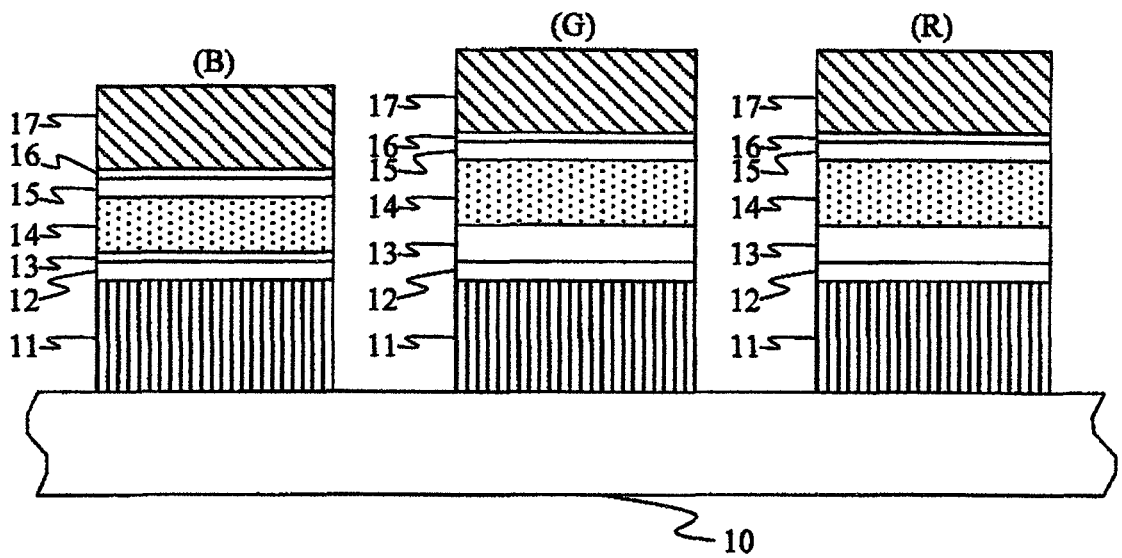
FIG. 4 is a sectional view showing a pixel portion of Example 2.

Other than the abovementioned structure, as shown in FIG. 4, it is possible to form hole injection layers 12, electron transport layers 15 and electron injection layers 16 common to three light-emitting portions, and that hole transport layers 13 have thicknesses of 10 nm in the blue light-emitting portion (B), and 25 nm in the green light-emitting portion (G) and the red light-emitting portion (R), thereby providing the same effects. In this case, the electron transport layers 15 have a thickness of 20 nm. The light-emitting portions (B, G and R) also have the thickness relationship represented as (blue light-emitting portion (B)<green light-emitting portion (G)=red light-emitting portion (R)).

EXAMPLE 3

Example 3 differs from Example 1 shown in FIG. 1 in the following manufacture steps. In Example 3, hole transport layers 5 were formed with the procedure described below. First, a hole transport layer common to all of light-emitting portions (B, G and R) was formed through vacuum deposition to have a thickness of 30 nm. Next, a material for the hole transport layer was evaporated with a thickness of 35 nm in the green light-emitting portion (G) and the red light-emitting portion (R) through vapor deposition using a mask with a fine pattern. As a result, the blue light-emitting portion (B) has a thickness of 30 nm, and the green light-emitting portion (G) and the red light-emitting portion (R) have a thickness of 65 nm. Such deposition can provide an organic light-emitting device having the same structure as that in Example 1 while the number of the steps of the vapor deposition using the mask with the fine pattern is reduced by one.

EXAMPLE 4

Figure 5:
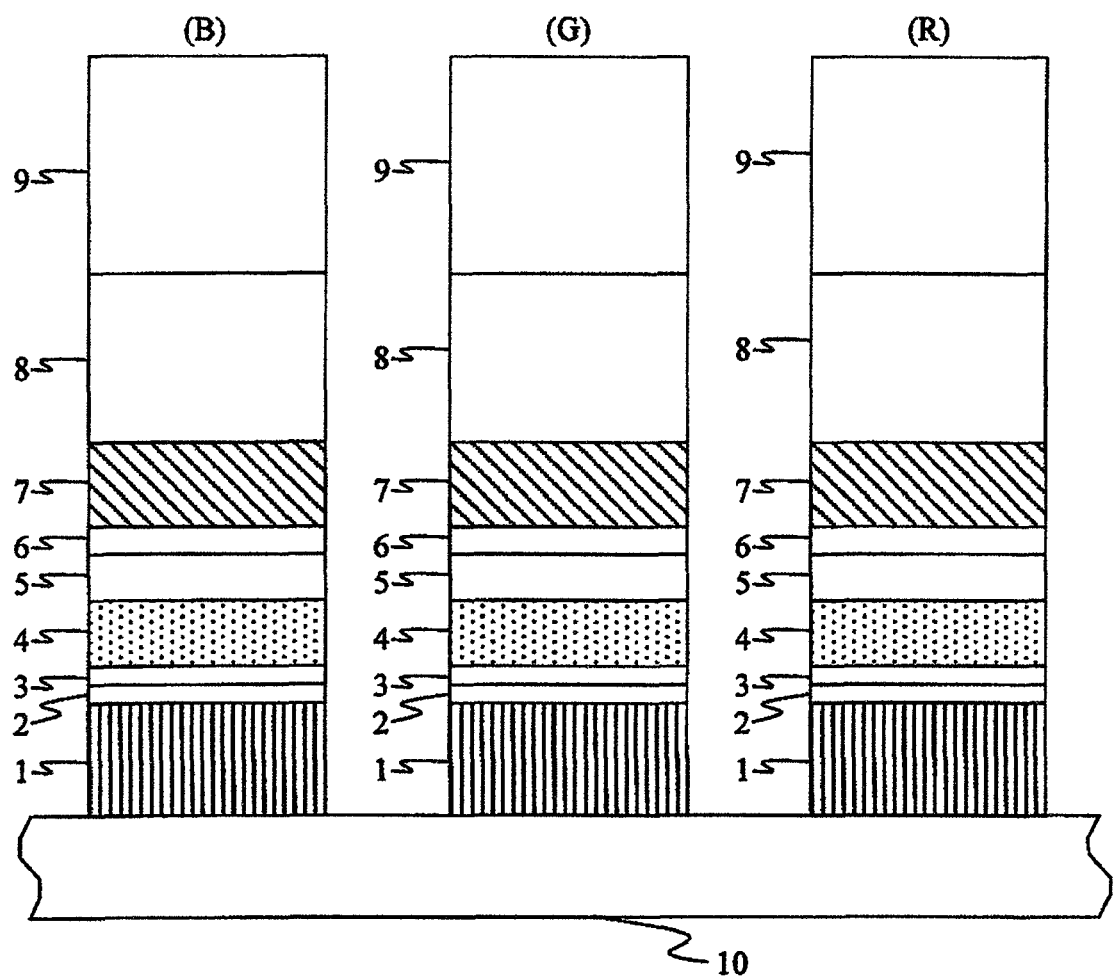
FIG. 5 is a sectional view showing a pixel portion of Example 4.

FIG. 5 is a sectional view showing a pixel portion of Example 4. Example 4 differs from Example 1 in the following points. First, a first passivation film 8 and a second passivation film 9 were sequentially formed on an upper electrode 7. The first passivation film was made of SiOx having a thickness of 200 nm. The second passivation film was made of SiNx having a thickness of 300 nm. The formation of the first and second passivation films allows light in colors emitted from organic light-emitting layers 4 in light-emitting portions (B, G and R) to be taken with resonance.

The other layers have the same thicknesses as those in the blue light-emitting portion (B) of Example 1. Specifically, hole transport layers 5 have the same thickness in all of the light-emitting portions (B, G and R), and the light-emitting portions (B, G and R) have the same thickness. The measurement of the efficiency in Example 4 in a similar manner to that in Example 1 showed that the ratio of the efficiency in Example 4 to Comparative Example 1 was 1.0.

EXAMPLE 5

Example 5 differs from Example 2 shown in FIG. 3 in the following points. In Example 5, an electron transport layer 15 in a blue light-emitting portion (B) is made of a material different from a material of that in a green light-emitting portion (G) and a red light-emitting portion (R). Specifically, the material for electron transport in the blue light-emitting portion (B) was tris(8-hydroxyquinolinato)aluminum. The material for electron transport in the green light-emitting portion (G) and the red light-emitting portion (R) was a silole derivative.

The electron mobility of tris(8-hydroxyquinolinato)aluminum is approximately $1\times10^{-5}$ cm$^2$/V. On the other hand, the electron mobility of the silole derivative is $2\times10^{-4}$ cm$^2$/V which is more than ten times larger than the former. The use of the silole derivative for the material for electron transport in the green light-emitting portion (G) and the red light-emitting portion (R) prevents the driving voltage for the green light-emitting portion (G) and the red light-emitting portion (R) from increasing significantly relative to that for the blue light-emitting portion (B). As a result, the supply voltage can be reduced as a whole to achieve low power consumption.

EXAMPLE 6

Figure 6:
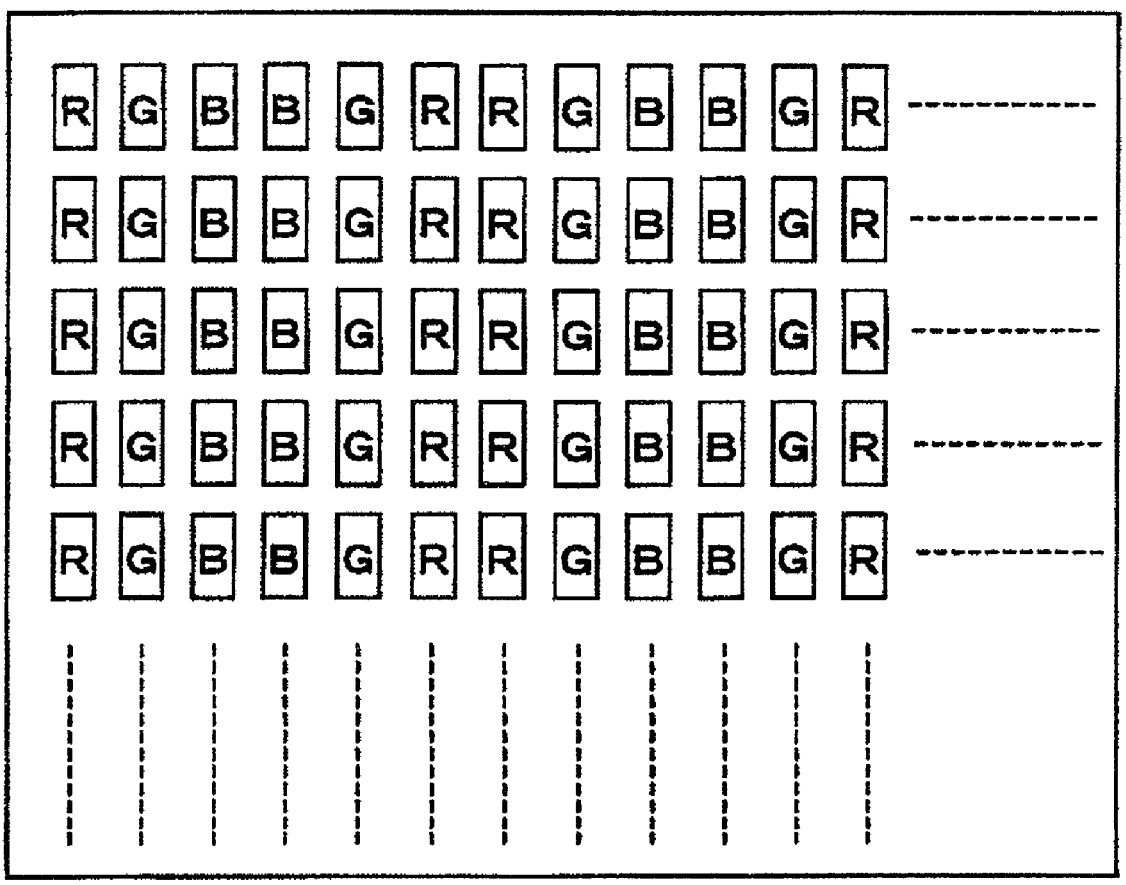
FIG. 6 shows a layout of subpixels of Example 6.

FIG. 6 shows a layout of subpixels of an organic light-emitting apparatus according to the present invention. Example 6 differs from Example 1 in the following points. In FIG. 6, light-emitting portions (subpixels) of the same color are arranged in the vertical direction. Light-emitting portions are arranged in the horizontal direction as R (red), G (green), B (blue), B (blue), G (green), R (red), R (red), G (green), B (blue), etc.

With the arrangement of the light-emitting portions, the hole transport layers 5 in the green light-emitting portion (G) and the red light-emitting portion (R) can be formed by using a mask having a fine pattern that includes a metal portion having a width corresponding to two subpixels. Conventionally, vapor deposition was performed for each color and thus the metal portion of the mask having the fine pattern had a width corresponding to one subpixel which is equal to a half of the width in Example 6, thereby causing a problem of low accuracy in manufacture of the mask. However, the layout of the subpixels in Example 6 can enhance the accuracy in manufacture of the mask to produce a high-resolution display device.

EXAMPLE 7

Figure 7:
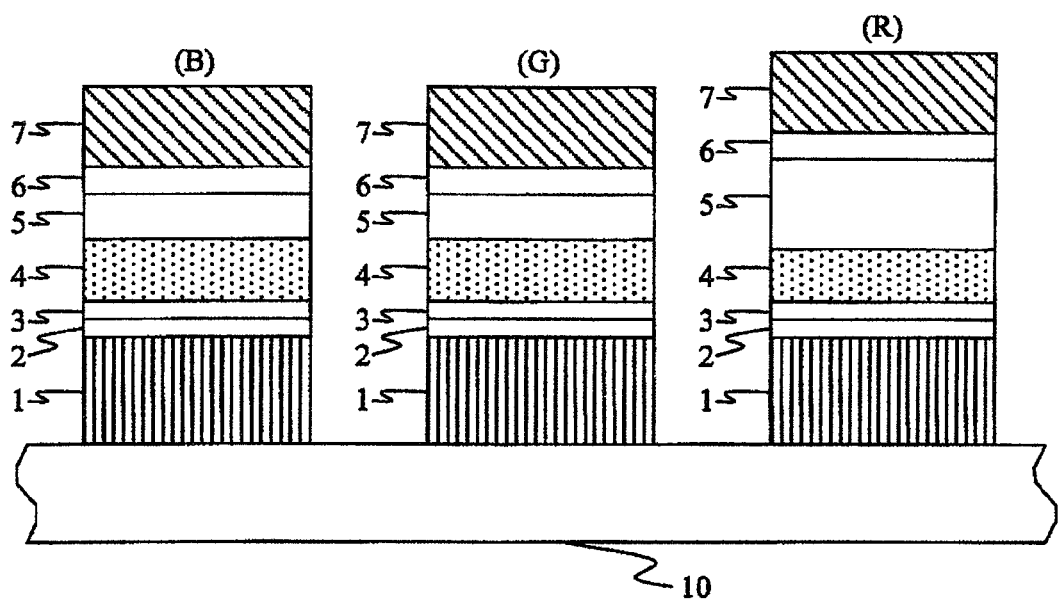
FIG. 7 is a sectional view showing a pixel portion of Example 7.

FIG. 7 is a sectional view showing a pixel portion of Example 7. Example 7 differs from Example 1 shown in FIG. 1 in the following points. In Example 1, the light-emitting portions (B, G and R) have the thickness relationship represented as (blue light-emitting portion (B)<green light-emitting portion (G)=red light-emitting portion (R)). In example 7, light-emitting portions have a thickness relationship represented as (blue light-emitting portion (B)=green light-emitting portion (G)<red light-emitting portion (R)). This can provide the same effects as those in Example 1.

EXAMPLE 8

Figure 8:
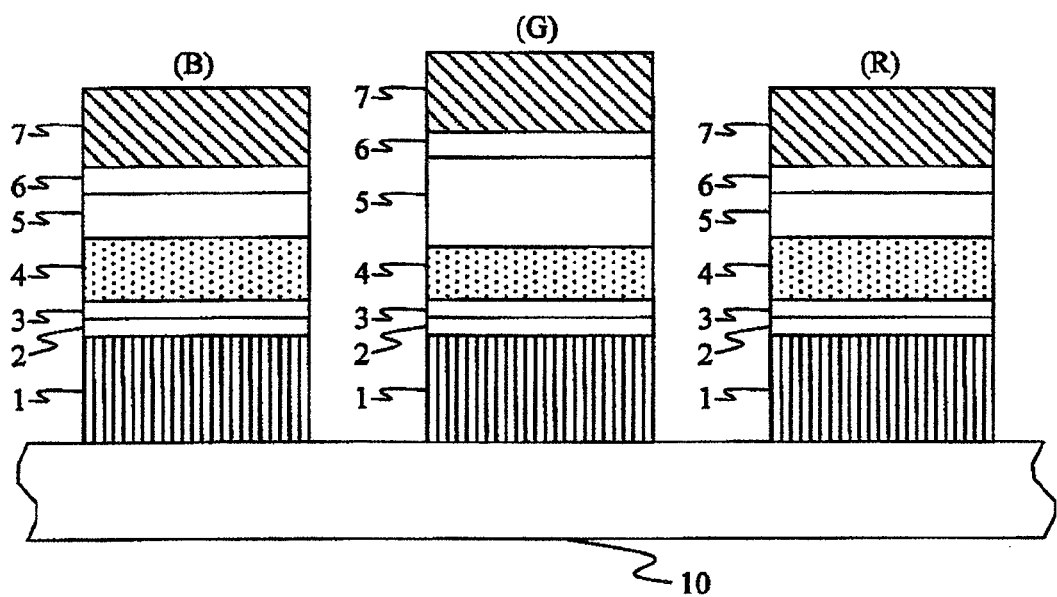
FIG. 8 is a sectional view showing a pixel portion of Example 8.

FIG. 8 is a sectional view showing a pixel portion of Example 8. Example 8 differs from Example 1 shown in FIG. 1 in the following points. In Example 1, the light-emitting portions (B, G and R) have the thickness relationship represented as (blue light-emitting portion (B)<green light-emitting portion (G)=red light-emitting portion (R)). In example 8, light-emitting portions have a thickness relationship represented as (blue light-emitting portion (B)=red light-emitting portion (R)<green light-emitting portion (G)). This can provide the same effects as those in Example 1.

Advantages of the Invention

As described above, according to the present invention, while the two light-emitting portions (green light-emitting portion and red light-emitting portion) include many layers having the common thicknesses, the efficiency of light emission thereof is not reduced, and it is possible to prevent an increase in the number of steps for vapor deposition using a mask with a fine pattern.

In addition, the present invention can be applied to realize easily a self-emission thin display device with high efficiency which can be used for a display device in television, various information terminals and the like.

The invention claimed is:

1. An organic light-emitting display device comprising:
a blue light-emitting portion, a green light-emitting portion and a red light emitting portion which are placed on a substrate;
an organic light-emitting layer in each of the light-emitting portions; and
an upper electrode and a lower electrode for causing each of the organic light-emitting layers to emit light,
wherein one of the upper electrode and the lower electrode is a transparent electrode, and the other is a reflecting electrode,
wherein the distances from the organic light-emitting layers to the upper electrodes are the same in at least two of the light-emitting portions;
wherein the three light-emitting portions have a film thickness relationship between the transparent electrode and the organic light-emitting layer represented as (blue light-emitting portion=red light-emitting portion<green light-emitting portion); and
wherein film thicknesses between the reflecting electrodes and the organic light-emitting layers are the same in said three light-emitting portions.

2. The organic light-emitting display device according to claim 1, wherein film thicknesses between the transparent electrodes and the organic light-emitting layers are the same in said two light-emitting portions.

3. The organic light-emitting display device according to claim 1, wherein film thicknesses between the reflecting electrodes and the organic light-emitting layers are the same in said two light-emitting portions.

4. The organic light-emitting display device according to claim 1, wherein film thicknesses between the transparent electrodes and the organic light-emitting layers are the same in the three light-emitting portions.

5. The organic light-emitting display device according to claim 1, wherein the upper electrode is the transparent electrode and the lower electrode is the reflecting electrode.

6. The organic light-emitting display device according to claim 1, wherein the upper electrode is the reflecting electrode and the lower electrode is the transparent electrode.

7. The organic light-emitting display device according to claim 1, wherein a film between the transparent electrode and the organic light-emitting layer is a hole transport layer when the upper electrode serves as an anode and the lower electrode serves as a cathode.

8. The organic light-emitting display device according to claim 1, wherein a film between the transparent electrode and the organic light-emitting layer is an electron transport layer when the upper electrode serves as a cathode and the lower electrode serves as an anode.

9. The organic light-emitting display device according to claim 1, wherein the thickness of a film between the transparent electrode and the organic light-emitting layer is thicker in the green light-emitting portion and the red light-emitting portion than in the blue light-emitting portion, and the film has a higher electron mobility in the green light-emitting portion and the red light-emitting portion than in the blue-light emitting portion.

10. The organic light-emitting display device according to claim 1, wherein the light-emitting portions are sequentially arranged such that the blue light-emitting portions are placed adjacent to each other.

11. The organic light-emitting display device according to claim 1, further comprising a passivation layer on the transparent electrode, wherein the distances from the organic light-emitting layers to the passivation layers are the same in the three light-emitting portions.

* * * * *